United States Patent [19]

Valentian

[11] Patent Number: 4,836,771
[45] Date of Patent: Jun. 6, 1989

[54] GRADIENT OVEN FOR ORIENTED SOLIDIFICATION, IN PARTICULAR BY THE BRIDGMAN METHOD

[75] Inventor: Dominique Valentian, Vernon, France

[73] Assignee: Societe Europeene de Propulsion, France

[21] Appl. No.: 182,796

[22] Filed: Apr. 18, 1988

[30] Foreign Application Priority Data

Apr. 27, 1987 [FR] France ............................... 87 05941

[51] Int. Cl.$^4$ ..................... F27B 14/00; E01C 19/45
[52] U.S. Cl. ..................................... 432/210; 432/13; 126/343.5 A
[58] Field of Search ........................ 432/10, 13, 210; 126/343.5 A

[56] References Cited

U.S. PATENT DOCUMENTS

| | | | |
|---|---|---|---|
| 2,358,624 | 9/1944 | Burry | 126/343.5 A |
| 2,773,496 | 12/1956 | Czarnecki | 126/343.5 A |
| 3,604,693 | 9/1971 | Groepler | 126/343.5 A |
| 4,024,854 | 5/1977 | Park et al. | 126/343.5 A |
| 4,027,656 | 6/1977 | Geddes et al. | 126/343.5 A |
| 4,402,304 | 9/1983 | Corey | 126/343.5 A |
| 4,505,669 | 3/1985 | Rogers | 432/13 |
| 4,623,279 | 11/1986 | Smith | 126/343.5 A |

*Primary Examiner*—Henry C. Yuen
*Attorney, Agent, or Firm*—Poms, Smith, Lande & Rose

[57] ABSTRACT

The gradient oven for oriented solidification, in particular by the Bridgman method, comprises an enclosure (4) successively defining along a cartridge (7): a heating zone (1), an adiabatic zone (2), and a heat sink (3). Means (8) are provided for displacing the cartridge (7) at a predetermined speed relative to the enclosure (4). The adiabatic zone (2) of the gradient oven includes an outer fixed annular portion (21) mounted in fixed manner inside the enclosure (4), and a removable annular portion (22) which is coaxial with said fixed annular portion and which is mounted inside it, with the removable annular portion (22) being constituted by an assembly of components (221 to 224) having different thermal conductivities, thereby adapting the characteristics of the adiabatic zone (2) to the characteristics of the sample contained in the cartridge (7).

9 Claims, 4 Drawing Sheets

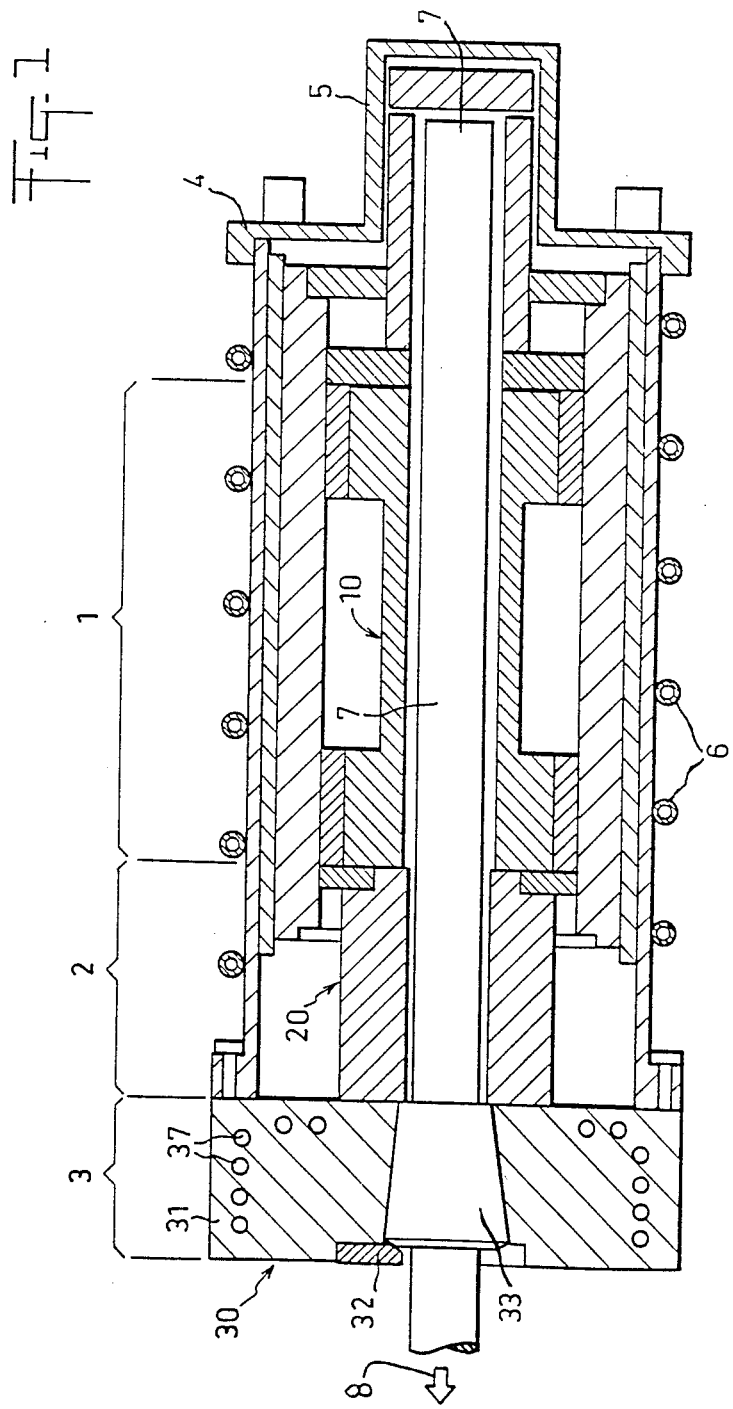

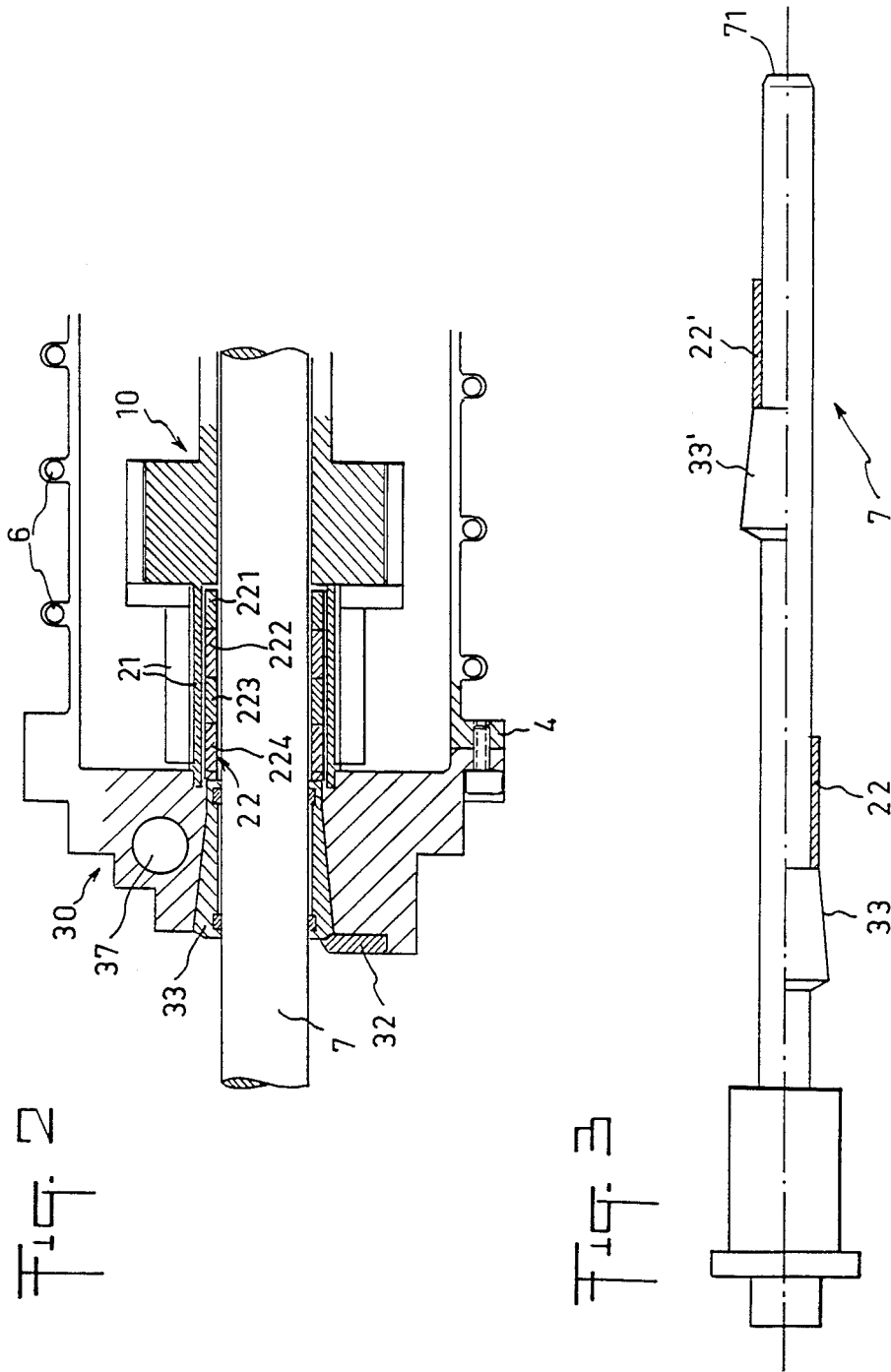

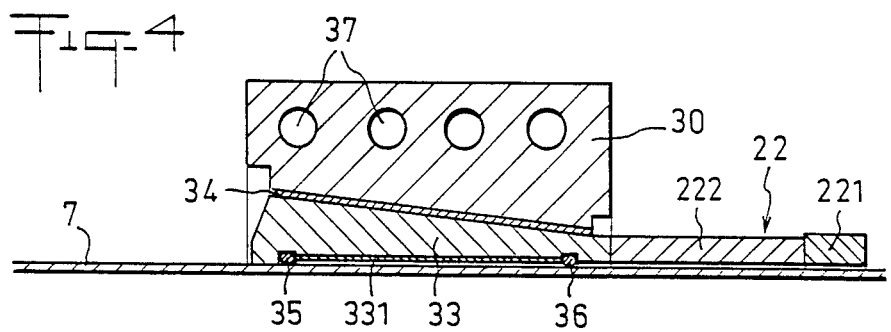
Fig-4
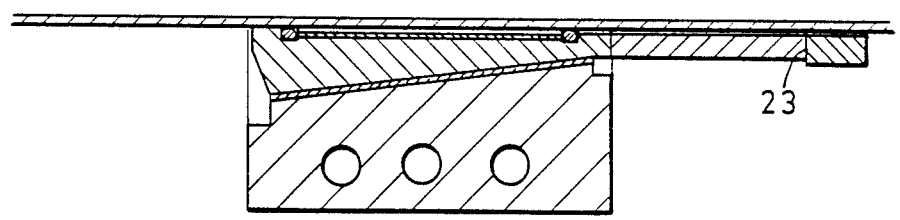
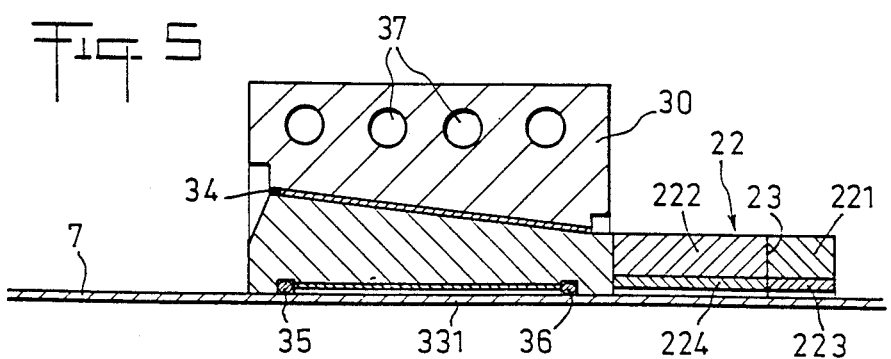
Fig 5
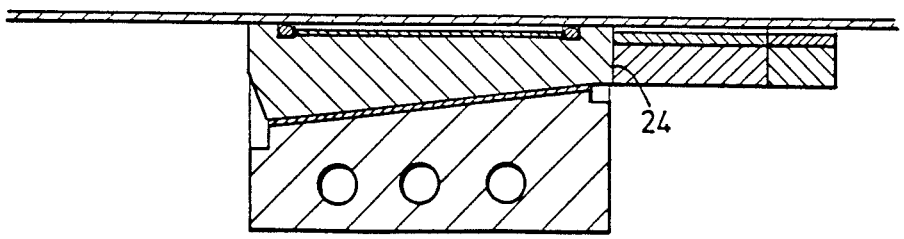

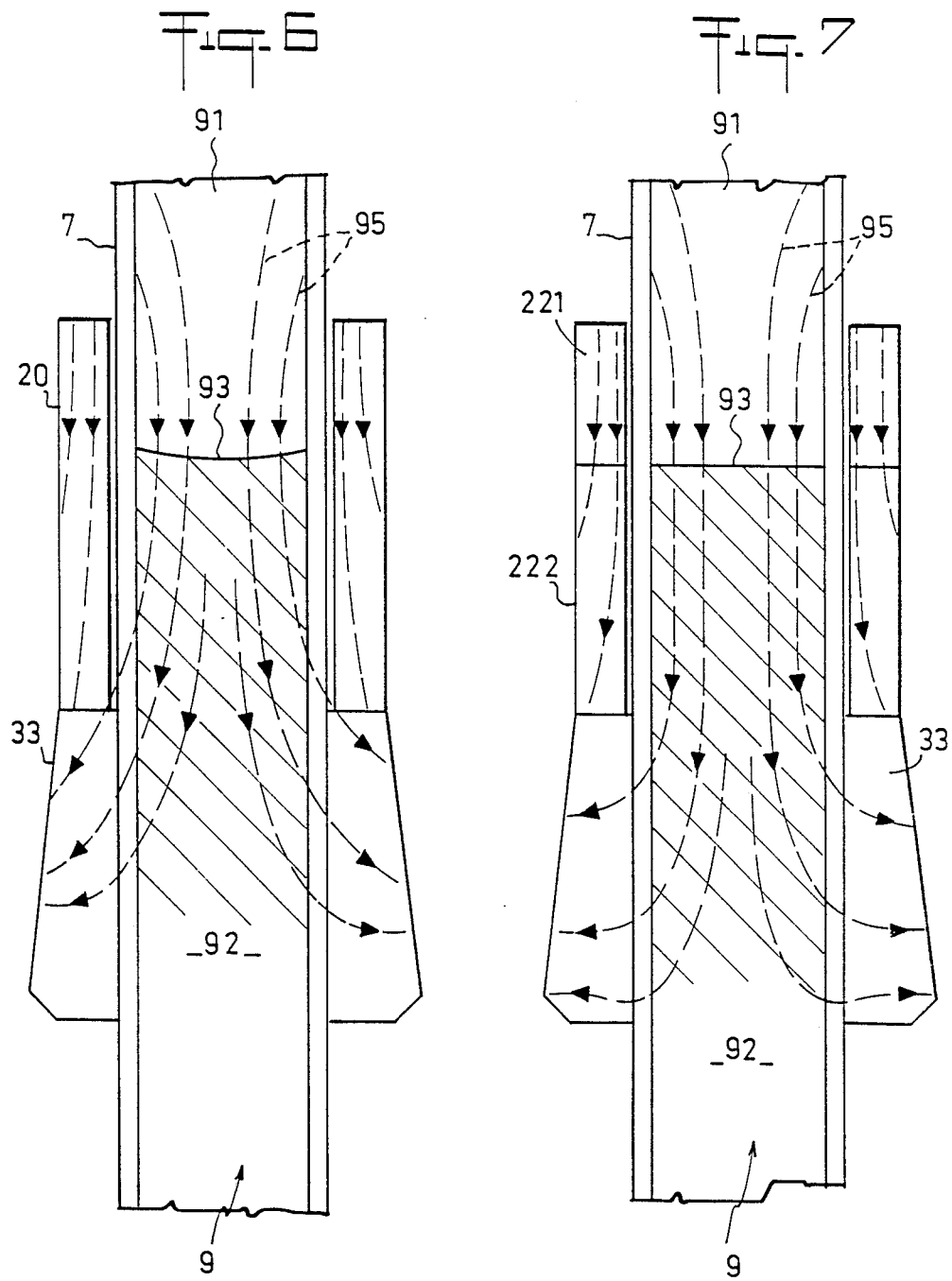

GRADIENT OVEN FOR ORIENTED SOLIDIFICATION, IN PARTICULAR BY THE BRIDGMAN METHOD

The present invention relates to a gradient oven for oriented solidification, in particular by the Bridgman method, the oven comprising an enclosure suitable for receiving a cartridge containing a sample to be melted and then solidified in oriented manner in order to constitute a monocrystalline material, the enclosure defining in succession along the cartridge a heating zone, an adiabatic zone, and a heat sink, with means being provided for moving the cartridge at predetermined speed relative to the enclosure, and with a frustoconical portion constituting a cooling ring being removably engaged in the heat sink inside the enclosure when a cartridge is inserted into the enclosure and including locking means for enabling the cartridge to slide relative to the frustoconical portion as it is progressively withdrawn from the enclosure.

BACKGROUND OF THE INVENTION

The manufacture of monocrystalline materials, and in particular semiconductors, generally takes place in gradient ovens which may be suitable for use in space, and which comprise either multi-user ovens in which different samples of different sizes or natures may be treated in succession, or else which may comprise single-experiment ovens such as those known under the name Mephisto and which make it possible to use an adiabatic zone which is optimized for a particular material.

In multi-user ovens, the adiabatic zone is not perfectly adapted to each sample and the results are not always of adequate quality. Single user ovens also suffer from a major drawback, in particular for space applications, in that they cannot be used for performing a plurality of oriented solidifications on different materials.

An article by J.M. Parsey Jr. and A. Thiel published in "Journal of Crystal Growth" in 1985 at pages 211-220, and entitled "A New Apparatus for the Controlled Growth of Single Crystals by Horizontal Bridgman Techniques" describes a method of making monocrystalline materials using ovens having active adiabatic zones. This makes it possible to adapt the oven to materials of different natures while still obtaining good quality results. However, this method is very complex and is thus not suitable for use in space.

The invention seeks to remedy the above-mentioned drawbacks and to provide a gradient oven in which the characteristics of the adiabatic zone can be adapted in simple manner to each sample, thereby defining a multi-user oven of improved quality compared with prior art ovens of this type and which is convenient to use, thereby making it usable, in particular, under microgravity in space.

SUMMARY OF THE INVENTION

These objects are achieved in a gradient oven of the type defined at the beginning of the description, wherein the adiabatic zone of the gradient oven comprises an outer fixed annular portion mounted in fixed manner inside the enclosure, and a removable annular portion which is coaxial with said fixed annular portion and which is mounted inside it, and wherein the removable annular portion is constituted by a set of components having different thermal conductivities.

Unlike conventional gradient ovens in which the adiabatic zone is in a single piece, an oven in accordance with the present invention makes it simple to modify the dimensions and the composition of its adiabatic zone in order to adapt it both to the size of the cartridge containing the sample to be treated and to the nature of the material in the sample.

More particularly, the removable annular portion is connected to the cooling frustoconical portion in such a manner as to be inserted into the adiabatic zone together with the cartridge and subsequently to be locked in place by said locking means in order to enable the cartridge to slide relative to the removable annular portion during said progressive withdrawal of the cartridge relative to the enclosure.

Preferably, the various components of the removable annular portion comprise at least two rings of different thermal conductivities and juxtaposed in the axial direction of the cartridge.

The various components of the removable annular portion may also comprise at least two coaxial rings of different thermal conductivities juxtaposed in the radial direction.

Advantageously, the removable annular portion comprises at least two axially aligned juxtaposed components whose thermal conductivities are in the same ratio as the thermal conductivities of the solid and liquid phases of the sample placed in the cartridge, with the interface between said components being situated level with the liquid-solid interface in the sample, in such a manner as to constitute a guard ring for the sample.

BRIEF DESCRIPTION OF THE DRAWINGS

Embodiments of the invention are described by way of example with reference to the accompanying drawings, in which:

FIG. 1 is a diagrammatic axial section through a conventional oven for crystal-pulling using the Bridgman method;

FIG. 2 is a diagrammatic axial section through a portion of a crystal-pulling oven in accordance with the invention and including a segmented adiabatic zone;

FIG. 3 is a view of a cartridge fitted with a set of removable parts constituted by a cooling ring and an adiabatic zone portion of a gradient oven in accordance with the present invention, with the set of removable parts being shown firstly in the beginning-of-pulling position and secondly in the end-of-pulling position;

FIG. 4 is an axial section through a portion of an oven in accordance with the invention showing the heat sink and the removable portion of the adiabatic zone for adapting to a large diameter cartridge;

FIG. 5 is an axial section view of a portion of an oven in accordance with the invention showing the heat sink and the removable portion of the adiabatic zone for adapting to a small diameter cartridge;

FIG. 6 is an axial section diagram through the adiabatic zone of a conventional oven showing the heat flow lines within the sample and the melt front in the sample; and FIG. 7 is an axial section diagram through a segmented adiabatic zone of an oven in accordance with the invention showing the heat flow lines within the sample and the melt front in the sample.

MORE DETAILED DESCRIPTION

FIG. 1 shows an example of a conventional crystal-pulling oven for making monocrystalline materials, and in particular semiconductors, using the Bridgman method. Such an oven comprises an enclosure 4 into which a cartridge 7 is inserted containing the material which is to be melted and then solidified.

The oven essentially comprises a heating zone 1, an adiabatic zone 2, and a cooling zone 3 which are distributed in that order from the end 5 of the oven opposite to the end of the oven via which the cartridge 7 is inserted and then withdrawn.

The heating zone 1 comprises heating means 10, for example electrical heating means, for causing heat to flow into the sample to be melted. Means 6 for cooling the outer walls of the oven are disposed around the enclosure 4 over the heating zone 1 and the adiabatic zone 2. These cooling means may comprise, for example, ducts disposed helically around the enclosure 4 and conveying a cooling fluid.

The adiabatic zone 2 comprises a block 20 disposed around the cartridge 7 and intended to ensure that the heat flow inside the sample 9 is essentially unidirectional in nature (FIG. 6). The solidification front 93 which constitutes the interface between the liquid phase 91 of the sample formed in the heating zone 1 and the solid phase 92 formed by the influence of the cooling zone 3 is situated inside the adiabatic zone 2. The planeness of the solidification front 93 and the corresponding reduction in the quantity of defects in the monocrystal produced are improved with improving unidirectional nature in the heat flow 95.

The cooling zone 93 or heat sink may be radiatively coupled or conductively coupled to the cartridge 7 and may comprise a block 31 having ducts 37 therein along which there flows a cooling liquid such as water. A cooling ring 33 which is frustoconical in shape and which is coaxial with the cartridge 7 may be inserted in the cooling zone 3 inside the block 31 when the cartridge 7 is inserted in the oven. A removable stop 32 then holds the ring 33 inside the block 31 while the cartridge 7 is withdrawn during the pulling operation per se, thereby solidifying the molten sample by controlled displacement of the cartridge 7 relative to the heating zone 1.

The cartridge 7 is essentially tubular in shape and is closed at its cold end, whereas its other end 71 is compatible with the use of conventional volume compensating devices (e.g. of the piston and spring type) required by the differences in density between the liquid phase and the solid phase.

In practice, the adiabatic zone does not function perfectly and this gives rise to the solidification front being deformed as shown in FIG. 6.

By virtue of the present invention, this deformation may be reduced insofar as a portion 22 of the block 20 of the adiabatic zone 2 is removable and may be matched to each sample.

As can be seen in FIG. 2, in accordance with the present invention, the block 20 of the adiabatic zone 2 is split into a first outer portion 21 which is permanently fixed to the oven and a second portion 22 which is coaxial, removable, and located inside the first portion. The removable second portion 22 is inserted into the adiabatic zone 2 together with the samples to be melted and serves to match the adiabatic zone 2 both to the diameter of the cartridge 7 and to the thermal conductivity of the sample to be melted.

More particularly, the internal removable portion is segmented and is constituted by a set of components 221, 222, 223, and 224 of different thermal conductivities. This makes it possible to match the adiabatic zone 2 to the differences in thermal conductivity of the sample between its liquid phase and its solid phase.

The thermal conductivity $\lambda_L$ of the liquid phase 91 of the sample 9 is different from the thermal conductivity $\lambda_S$ of the solid phase 92 of the same sample. For an oven of given geometry, the position of the solidification front 93 relative to the oven is known.

Consequently, providing the adiabatic zone 2 with a removable internal ring 22 comprising at least two components 221 and 222 disposed one after the other and juxtaposed along a radial plane makes it possible to define a particularly plane solidification front (FIG. 7). To do this, the two components 221 and 222 juxtaposed along the axis of the cartridge 7 should be selected to have respective thermal conductivities $\lambda_C$ and $\lambda_F$ having the same ratio as the thermal conductivities of the liquid and solid phases 91 and 92 of the sample 9 level with which they are situated, with the interface 23 between the components being situated at the same level as the liquid/solid interface 92 whose position is predetermined as a function of the geometrical characteristics of the oven. The removable annular portion 22 of the adiabatic zone 2 thus constitutes a guard ring for the sample.

The consecutive components 221, 222, 223, and 224 of the removable annular portion 22 may be constituted by ceramics or by metals in the form of sleeves which are juxtaposed in the axial direction (e.g. components 221 and 222 in FIGS. 4 and 5, and components 223 and 224 in FIG. 5) or which are juxtaposed in the radial direction (components 221 and 223 or components 222 and 224 in FIG. 5). The various sleeve-shaped components 221, 222, 223, and 224 are constituted by several distinct materials bonded to one another, for example by a refractory cement or by a high temperature adhesive. As a function of the different thermal conductivities of the materials of the various components 221, 222, 223, and 224 constituting the removable portion 22, it is possible to straighten out the heat flow lines 95 inside the sample and to completely compensate for the differences in thermal conductivity between the liquid and solid phases of the sample.

Insofar as the position and the shape of the melt front are solely dependent on the characteristics of the three zones 1, 2, and 3 of the oven, and in particular on the characteristics of the adiabatic zone 2, once the position of the melt front 92 has been determined by calculation, the segmentation of the removable portion 22 of the adiabatic zone can be designed with a high degree of accuracy.

Further, using a removable annular portion 22 in the adiabatic zone 2 makes it possible to modify the length of said zone by making an inner portion 22 which extends a little beyond the outer portion 21 into the heating zone 1 in order to reduce the gradient whenever the sample materials are particularly fragile.

As can be seen in FIGS. 4 and 5, the removable portion 22 of the adiabatic zone 2 and the cooling ring 33 may be matched to different cartridge diameters and thus make it possible to test samples of different diameters in the same oven.

FIG. 4 relates to a large diameter cartridge having a relatively thin removable internal portion 22 comprising two segments 221 and 222, and a cooling ring 33 which is also relatively thin and which is placed inside the body 30 of the heat sink provided with a circuit 33 for circulating cooling water. In conventional manner, the cooling ring defines a ring of liquid metal 331 around the cartridge 7 in an annular space delimited by two sealing rings 35 and 36 placed at the two ends of the cooling ring 33. A heat conducting gasket 34 is also disposed at the junction between the body 30 and the ring 33 outside the adiabatic zone.

FIG. 5 shows a small diameter cartridge which thus has a removable inner portion 22 which is relatively thick and which, for example, comprises four segments 221 to 224. The cooling ring is also thicker than in the FIG. 4 case but has the same general structure.

As shown in FIGS. 4 and 5, it is possible to use a single oven in conjunction with several sets of parts 22 and 33 having outside walls which are identical in shape and size and having inside walls which are of different shapes and sizes in order to adapt the oven to cartridges 7 of different diameters, with each set of parts comprising a frustoconical cooling ring 33 and a removable annular portion 22 which is cylindrical in shape and which is connected to the cooling ring.

As shown in two half-views in FIG. 3, the assembly constituted by a cooling ring 33 and a removable portion 22 of the adiabatic zone 2 is inserted into the oven together with the cartridge 7 in a beginning-of-pulling position, and then the cartridge 7 is withdrawn progressively from the oven by sliding relative to the assembly 33 and 32 which is held in the oven in its initial position, for example by means of the stop 32 shown in FIG. 2. At the end of pulling, the assembly 33, 22 is thus shifted relative to the end 71 of the cartridge and is referenced in FIG. 3 when in its end-of-pulling position by references 33' and 22'. After the process of making a monocrystal of metal or of semiconductor material has terminated, the assembly 33' and 22' can easily be withdrawn in order to allow another cartridge fitted with another set of parts 33 and 22 to be inserted.

I claim:

1. A gradient oven for oriented solidification in particular comprising:
    an enclosure suitable for receiving a cartridge containing a sample to be melted and then solidified in oriented manner in order to constitute a monocrystalline material;
    the enclosure defining in succession along the cartridge: a heating zone; and adiabatic zone; and a heat sink;
    means for moving the cartridge at a predetermined speed relative to the enclosure; and
    a frustoconical portion constituting a cooling ring suitable for being removably engaged in the heat sink inside the enclosure when a cartridge is inserted into the enclosure and including locking means for holding the frustoconical portion to enable the cartridge to slide relative to the frustoconical portion when the cartridge is progressively withdrawn from the enclosure;
    wherein said adiabatic zone comprises an outer fixed annular portion mounted in fixed manner inside the enclosure, and a removable annular portion which is coaxial with said fixed annular portion and which is mounted inside it; and
    wherein said removable annular portion is constituted by a set of components having different thermal conductivities.

2. A gradient oven according to claim 1, wherein the removable annular portion is connected to the frustoconical portion in such a manner as to be inserted into the adiabatic zone together with the cartridge and subsequently to be locked in place by said locking means in order to enable the cartridge to slide relative to the removable annular portion during said progressive withdrawal of the cartridge relative to the enclosure.

3. A gradient oven according to claim 1, wherein the various components of the removable annular portion comprise at least two rings of different thermal conductivities and juxtaposed in the axial direction of the cartridge.

4. A gradient oven according to claim 1, wherein the various components of the removable annular portion comprise at least two coaxial rings of different thermal conductivities which are juxtaposed in the radial direction.

5. A gradient oven according to claim 1, wherein the different thermal conductivity components are constituted by ceramics and by metals.

6. A gradient oven according to claim 1, wherein the removable annular portion comprises at least two axially aligned juxtaposed components whose thermal conductivities are in the same ratio as the thermal conductivities of the solid and liquid phases of the sample placed in the cartridge, with the interface between said components being situated level with the liquid-solid interface in the sample, in such a manner as to constitute a guard ring for the sample.

7. A gradient oven according to claim 1, wherein the various components constituting the removable annular portion are connected to one another by a refractory cement or a high temperature adhesive material.

8. A gradient oven according to claim 1, wherein the removable annular portion extends axially beyond the outer fixed annular portion into the heating zone.

9. A gradient oven according to claim 1, comprising a plurality of sets of parts having outside walls of identical shapes and sizes and having inside walls of different sizes or shapes for adapting a single oven to cartridges of different diameters, each set of parts including a frustoconical cooling ring and a cylindrical inner removable annular portion.

* * * * *